United States Patent
Tajima et al.

(10) Patent No.: US 7,915,618 B2
(45) Date of Patent: Mar. 29, 2011

(54) LIGHT-EMITTING DEVICE WITH POINT SYMETRICAL BONDING ELECTRODES

(75) Inventors: Hiroyuki Tajima, Aichi-ken (JP); Toshinori Takahashi, Aichi-ken (JP); Atsushi Tsuzuki, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 378 days.

(21) Appl. No.: 12/078,620

(22) Filed: Apr. 2, 2008

(65) Prior Publication Data
US 2008/0246043 A1    Oct. 9, 2008

(30) Foreign Application Priority Data

Apr. 4, 2007   (JP) ................. 2007-097899

(51) Int. Cl.
*H01L 33/00*    (2010.01)
(52) U.S. Cl. ................. 257/79; 257/81; 257/82; 257/88; 257/99; 257/692; 257/734; 257/784; 257/786; 257/E33.062; 257/E33.066
(58) Field of Classification Search .......... 257/79, 257/80, 81, 88, 99, 666, 678, 690, 692, 734, 257/735, E33.062, E33.066, 82, 676, 784, 786
See application file for complete search history.

(56) References Cited

FOREIGN PATENT DOCUMENTS

| JP | 9-321341 | 12/1997 |
| JP | 2001-127343 | 5/2001 |
| JP | 2001-143516 | 5/2001 |

OTHER PUBLICATIONS

Machine Translation of IDS Reference, 09-321341.*

* cited by examiner

*Primary Examiner* — David Vu
*Assistant Examiner* — Suberr Chi
(74) *Attorney, Agent, or Firm* — McGinn IP Law Group, PLLC

(57) ABSTRACT

A pair of bonding electrodes of each of light-emitting semiconductor devices of RGB is disposed in a point symmetrical relationship, the devices are mounted on a common electrode of a package, and a bonding wire is suspended from a commonized bonding electrode of the respective devices to the common electrode. Bonding wires are suspended from the other bonding electrodes of the respective devices to first to third electrodes on the package which are independent from one another.

20 Claims, 6 Drawing Sheets

CATHODES COMMONIZED

ANODES COMMONIZED

PROGRESS OF DETERIORATION

LIGHT-EMITTING DEVICE WITH POINT SYMETRICAL BONDING ELECTRODES

BACKGROUND OF THE INVENTION

1. Field of the Invention

The present invention relates to a light-emitting device, and more particularly to an improvement on a light-emitting device in which a plurality of light-emitting semiconductor devices are mounted.

2. Description of the Related Art

There has been known a light-emitting device in which a red light-emitting semiconductor device that emits red-base light, a green light-emitting semiconductor device that emits green-base light and a blue light-emitting semiconductor device which emits blue-base light are assembled into a single package so as to emit light of an arbitrary color.

In packages, with a view to simplifying wiring, it is preferable to commonize a wiring pattern on a cathode side or an anode side of a package. For example, when communizing a wiring pattern on the cathode side, a cathode common pad or electrode is provided on the package, so that cathode electrodes of the semiconductor devices are connected to this cathode common electrode. On the other hand, three electrically independent anode electrodes are provided on the package so as to be connected individually with anode electrodes of the semiconductor devices.

Whether to commonize cathode electrodes or anode electrodes of a plurality of light-emitting semiconductor devices is arbitrarily selected depending upon the application, purpose and the like of a light-emitting device.

There are various forms in which a cathode and an anode are disposed in a light-emitting semiconductor, and for example, in a red light-emitting semiconductor, an anode and a cathode are sometimes formed on different planes. A light-emitting semiconductor device like this constitutes a vertically energized chip. On the other hand, in a blue light-emitting semiconductor device which is made of a III group nitride system compound semiconductor device, an anode and a cathode are formed on the same plane.

These light-emitting semiconductor devices are selected as required to be mounted on a package, and as this occurs, the type of the package (cathode commonized or anode commonized) needs to be studied as a selection criterion.

From the viewpoint of commonization in parts, Patent Document No. 1 proposes a package that can be used as a cathode commonized type or an anode commonized type.

In addition, Patent Document No. 2 and Patent Document No. 3 also disclose techniques associated with this patent application by reference.

| | |
|---|---|
| Patent Document No. 1: | JP-A-9-321341 |
| Patent Document No. 2: | JP-A-2001-127343 |
| Patent Document No. 3: | JP-A-2001-143516 |

According to the technique disclosed in Patent Document No. 1, the single package can be used as the cathode commonized type or the anode commonized type.

However, a wire bonding pattern differs between a light-emitting device in which cathodes are commonized and a light-emitting device in which anodes are commonized. Because of this, although the package can be commonized, when manufacturing a light-emitting device, a manufacturing process differs between the cathode commonized type light-emitting device and the anode commonized type light-emitting device.

Then, the inventor and others have made every possible effort to realize a further commonization of parts of a light-emitting device, as well as a commonized manufacturing process that can be used to manufacture a light-emitting device, whether it is of the cathode commonized type or the anode commonized type.

SUMMARY OF THE INVENTION

The invention has been made with a view to solving the problem and the configuration thereof will be specified as follows.

According to a first aspect of the invention, there is provided a light-emitting device including a first light-emitting semiconductor device and a second light-emitting semiconductor device each having a first bonding electrode and a second bonding electrode on an upper surface thereof, and a package on which the first and second light-emitting semiconductor devices are mounted and comprising a common electrode which is connected commonly to the first bonding electrodes of the first and second light-emitting semiconductor devices, a first electrode which is connected to the second bonding electrode of the first light-emitting semiconductor device and a second electrode which is connected to the second bonding electrode of the second light-emitting semiconductor device, wherein in the first light-emitting semiconductor device and the second light-emitting semiconductor device, the first bonding electrode and the second bonding electrode are disposed in positions which lie in a point symmetrical relationship across a central point of each light-emitting semiconductor device as a center of symmetry, and wherein the first and second light-emitting semiconductor devices are mounted on the common electrode, a first bonding wire is suspended between the first bonding electrode of the first light-emitting semiconductor device and the common electrode, a second bonding wire is suspended between the first bonding electrode of the second light-emitting semiconductor device and the common electrode, a third bonding wire is suspended between the second bonding electrode of the first light-emitting semiconductor device and the first electrode, and a fourth bonding wire is suspended between the second boding electrode of the second light-emitting semiconductor device and the second electrode.

According to the light-emitting device of the first aspect of the invention which is specified as has been described above, since in the first light-emitting semiconductor device and the second light-emitting semiconductor device, the first bonding electrode and the second bonding electrode are disposed in the positions which lie in the point symmetrical relationship across the central point of each light-emitting semiconductor device as the center of symmetry, when the light-emitting semiconductor devices are rotated through 180 degrees on the common electrode, the positions of the first bonding electrode and the second bonding electrode are replaced by each other. By selecting the bonding electrode that is to be connected to the common electrode in each light-emitting semiconductor device, a cathode commonized type light-emitting device and an anode commonized type light-emitting device can be manufactured separately using the same package.

When each of the light-emitting semiconductor devices is rotated through 180 degrees in the same position on the common electrode, the absolute positions of the pair of bonding electrodes are kept unchanged. On the other hand, since the positions of the bonded areas and the first to third electrodes are fixed, even though the light-emitting semiconductor devices are rotated through 180 degrees, there should be no change in wire bonding patterns between the bonding electrodes of the light-emitting semiconductor devices and the electrodes on the package.

Namely, according to the inventive step specified by the first aspect of the invention, the same package can be used for the cathode commonized type light-emitting device or the anode commonized type light-emitting device. In addition, even in the event that the package is used for the light-emitting device of either type, there should be no change in wire bonding pattern. Consequently, even in the event that either of the cathode commonized type light-emitting device and the anode commonized type light-emitting device is selected, not only can the parts applicable to the selected device be provided but also the manufacturing process common for either of the types can be attained.

A second aspect of the invention will be specified as follows. Namely, according to the second aspect of the invention, there is provided a light-emitting device as set forth in the first aspect of the invention, including further a third light-emitting semiconductor device including a first bonding electrode and a second bonding electrode, the first bonding electrode and the second bonding electrode being disposed in the third light-emitting semiconductor device in positions which lie in a point symmetrical relationship across a central point of the third light-emitting semiconductor device as a center of symmetry, wherein a third electrode is provided further on the package, and the first light-emitting semiconductor device constitutes a light-emitting semiconductor device which emits red-base light, the second light-emitting semiconductor device constitutes a light-emitting semiconductor device which emits green-base light, and the third light-emitting semiconductor device is a light-emitting semiconductor device which emits blue-base light, and wherein the third light-emitting semiconductor device is mounted on the common electrode, and a fifth bonding wire is suspended between the first bonding electrode thereof and the common electrode and a sixth bonding wire is suspended between the second bonding electrode of the third light-emitting semiconductor device and the third electrode.

The inventive step according to the second aspect specifies that the light-emitting device according to the first aspect includes the third light-emitting semiconductor device, and also when the light-emitting device includes the third light-emitting semiconductor device, the same function and advantage provided by the first aspect can be provided.

With the red light-emitting semiconductor device, the green light-emitting semiconductor device and the blue light-emitting semiconductor device provided on the single package, the color of light emitted from the light-emitting device can be controlled arbitrarily.

A third aspect of the invention will be specified as follows. Namely, according to the third aspect of the invention, there is provided a light-emitting device as set forth in the second aspect of the invention, wherein when viewing the three light-emitting semiconductor devices from the top, a center of gravity of the central points of the light-emitting semiconductor devices coincides with a central point of a bottom surface of the package.

According to the light-emitting device of the third aspect which is specified as has been described above, the center of gravity (hereinafter, also referred to simply as center of gravity from time to time) of the central points of the light-emitting semiconductor devices coincides with the central point of the bottom surface of the package when viewing the three light-emitting semiconductor devices from the top.

Since the center of the optical axis of the light-emitting device passes through the center of the bottom surface of the package, when the center of gravity of the three light-emitting semiconductor devices is caused to coincide with the center of the bottom surface of the package, light components emitted from the respective light-emitting semiconductor devices are uniformly balanced in light emitted from the light-emitting device. Consequently, light emitted from the light-emitting device can easily be controlled to an arbitrary color.

A fourth aspect of the invention will be specified as follows. Namely, according to the fourth aspect of the invention, there is provided a light-emitting device as set forth in the third aspect of the invention, wherein the third light-emitting semiconductor device that emits the blue-base light is disposed at the central point of the package.

In the red-base, green-base and blue-base lights, the blue-base light is liable to make a worst damage on a side wall of the package. By disposing the third light-emitting semiconductor device that emits the light concerned in the center of the package, a longest distance can be secured between the third light-emitting semiconductor device and the side wall of the package, and hence, the service life of the package can be extended. Consequently, the durability of the light-emitting semiconductor devices can be increased.

A fifth aspect of the invention will be specified as follows. Namely, according to the fifth aspect of the invention, there is provided a light-emitting device as set forth in the fourth aspect of the invention, wherein the bottom surface of the package is rectangular, the first, second and third electrodes are formed in three corner portions thereof, and the third light-emitting semiconductor device which emits the blue-base light is disposed on a base of an imaginary triangle that is formed by the three electrodes.

According to the light-emitting device that is specified as has been described above, the wire is suspended from the second bonding electrode of the third light-emitting semiconductor device to either of the two electrodes which make up the base of the imaginary triangle, and the wire is suspended from the second bonding electrode of the light-emitting semiconductor device which is disposed out of the imaginary triangle to the other of the two electrodes which make up the base of the imaginary triangle. These two wires can be disposed in substantially parallel to the base of the imaginary triangle. In addition, the wire is suspended from the second bonding electrode of the light-emitting semiconductor device that is disposed within the imaginary triangle to the electrode which is disposed at an apex of the imaginary triangle. This wire can be disposed vertical to the base of the imaginary triangle. Consequently, the intersection of the three wires can be prevented in an ensured fashion.

BRIEF DESCRIPTION OF THE DRAWINGS

FIG. 6 shows a positional relationship of the blue light-emitting semiconductor devices relative to the other light-emitting semiconductor devices, of which FIG. 6(A) is a positional relationship adopted in the embodiment, and FIG. 6(B) is a positional relationship of a comparison example.

DESCRIPTION OF THE PREFERRED EMBODIMENTS

Hereinafter, an embodiment of the invention will be described by reference to an example shown in the accompanying drawings.

Figure 1:
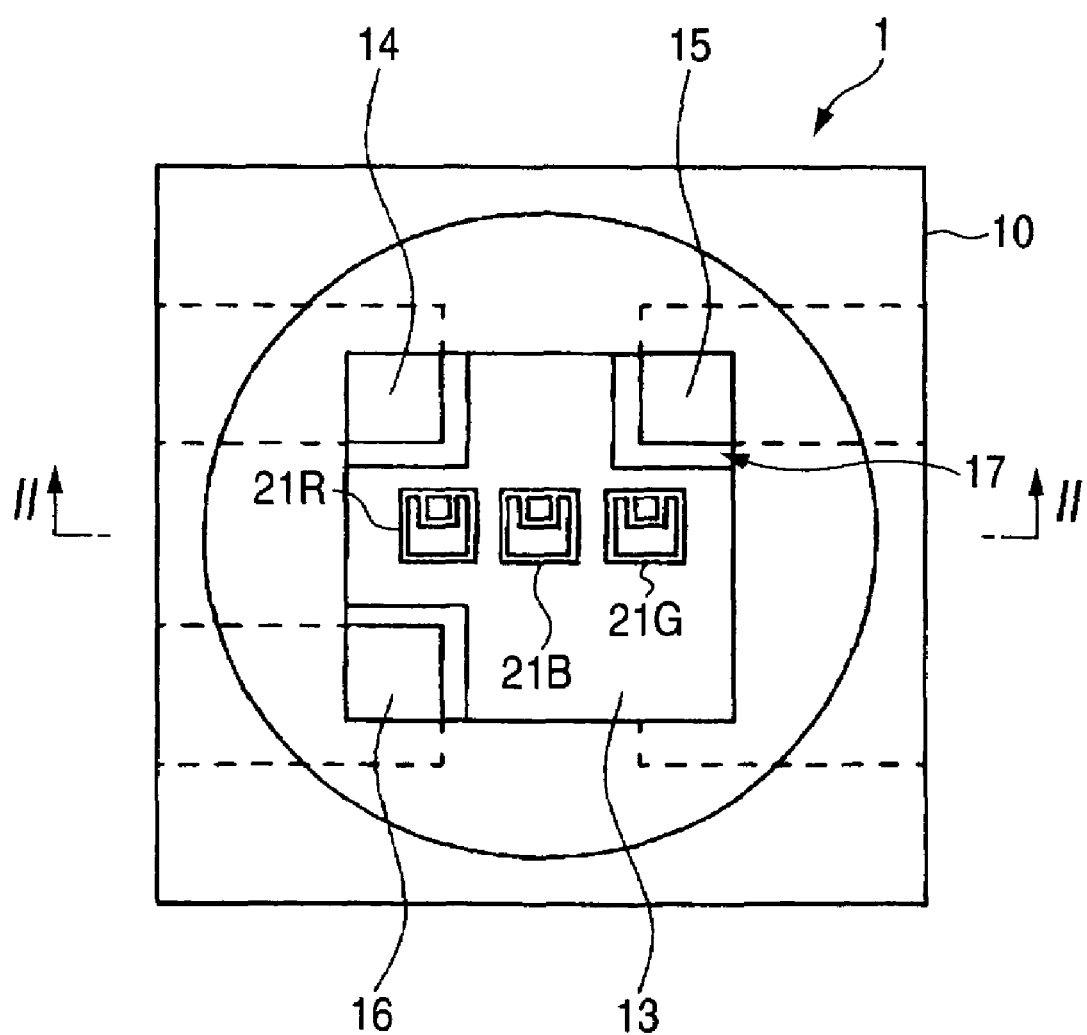
FIG. 1 is a plan view of a light-emitting device of an embodiment of the invention.
Figure 2:
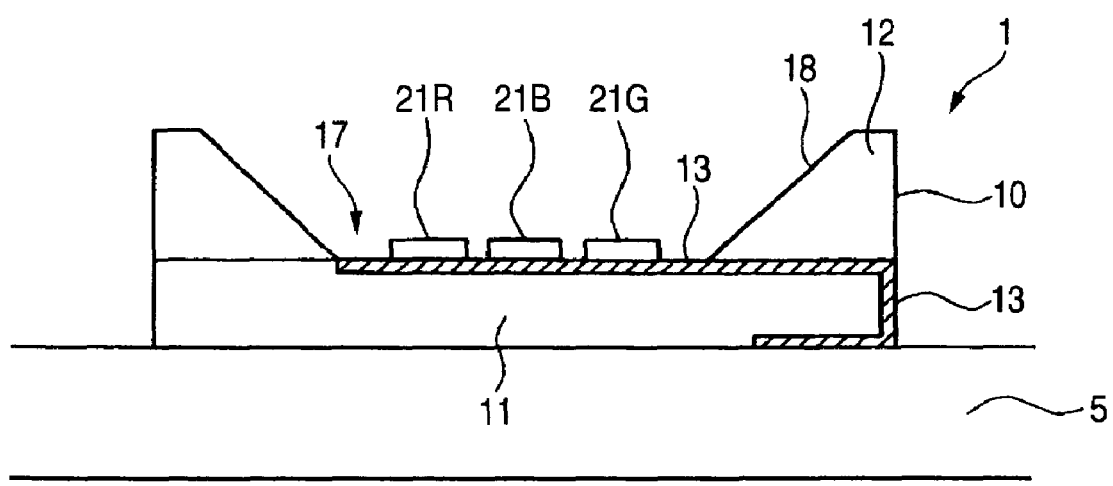
FIG. 2 is a sectional view taken along the line II-II in FIG. 1.

Fig. q is a plan view of a light-emitting device according to an embodiment of the invention, and FIG. 2 is a sectional view taken along the line II-II in FIG. 1.

The light-emitting device 1 of the embodiment includes a package 10 and first to third light-emitting semiconductor devices 21R, 21G, 21B.

The package 10 includes a substrate portion 11 and a reflecting wall 12. The substrate portion 11 is made of an inorganic material such as synthetic resin or alumina, and a common pad or electrode 13 and first to third electrodes 14, 15, 16 are formed on a surface thereof. The respective electrodes 13 to 16 extend from an upper surface to a lower surface of the substrate portion 11 for electric connection to wiring patterns on a wiring circuit board 5.

A bottom surface 17 of the package 10 is rectangular and the substrate portion 11 is exposed in this bottom surface 17. The first to third electrodes 14, 15, 16 are provided in corner portions on the rectangular bottom surface 17. The common electrode 13 may be disposed in at least positions where the light-emitting semiconductor devices 21R, 21G, 21B are mounted and have an area where bonding wires from the respective light-emitting semiconductor devices 21R, 21G, 21B can be received.

With a view to securing a high reflection factor, the reflecting wall 12 is formed of a white-base resin material into a ring shape. An inner circumferential surface of the ring is made into a tapered surface, which constitutes a reflecting plane 18. Silver or the like can be plated in layer on the reflecting plane 18. The reflecting wall 12 is fixed to the substrate portion 11 with an adhesive material. The substrate portion 11 and the reflecting wall 12 can be molded into one piece. In this case, the electrodes 13 to 16 are formed on an upper surface of the substrate portion 11 in such a manner as to continuously extend to a lower surface thereof through via holes.

Figure 3:
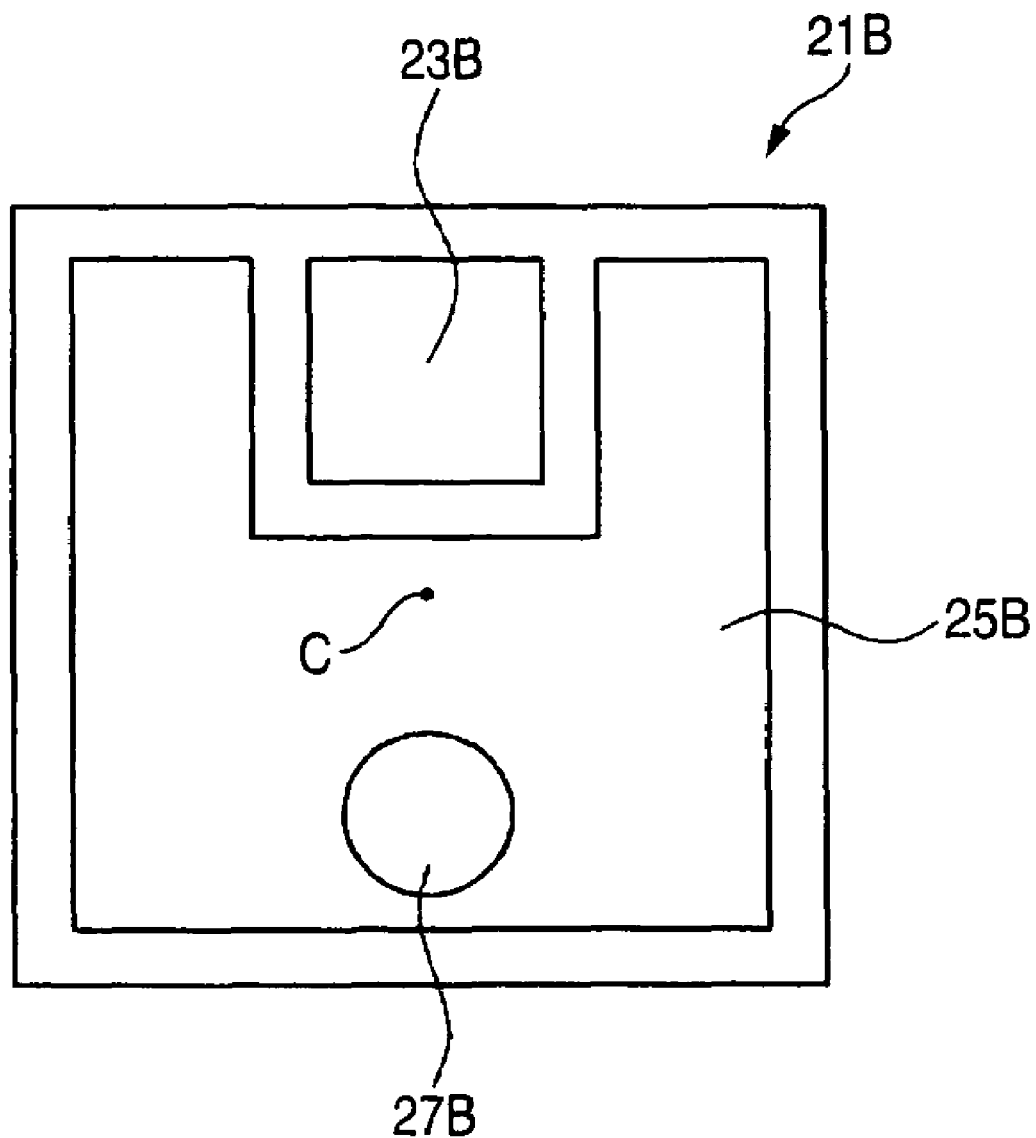
FIG. 3 is a plan view showing an electrode construction of a blue light-emitting semiconductor device.

FIG. 3 shows an example of the blue light-emitting semiconductor device 21B being mounted on the package 10. This blue light-emitting semiconductor device 21B is a face-up type light-emitting semiconductor device in which an n electrode 23B (anode) and a p electrode 25B (cathode) are provided on an upper surface thereof. The n electrode 23B is formed into a rectangular shape and a wire can be bonded on an upper surface thereof. Namely, by itself, the n electrode 23B constitutes an n bonding electrode. The p electrode 25B occupies most of the surface of the device and is made up of a transparent electrode formed of ITO or Zno so as to transmit light from a light-emitting layer therethrough. Reference 27B denotes a p bonding electrode which is formed on the p electrode 25B and is formed into a circular shape. This is because the p bonding electrode 27B can easily be discriminated from the n bonding electrode 23B, which is rectangular, during a wire bonding operation.

In addition, the n bonding electrode 23B and the p bonding electrode 27B are located in positions which lie in a point symmetrical relationship across a central point of the light-emitting semiconductor device 21B as a center of symmetry as viewed from the top.

The blue light-emitting semiconductor device 21B can be formed of a III group nitride system compound semiconductor. Here, the III group nitride system compound semiconductor is expressed, as a general formula, $Al_xGa_yIn1_{-x-y}N$ ($0 \leq x \leq 1, 0 \leq y \leq 1, 0 \leq x+y \leq 1$). Those containing Al include a so-called two-element system such as AlN and a so-called three-element system such as $Al_xGa1_{-x}N$ and $Al_xIn1_{-x}N$ (in these, $0<x<1$). In the III group nitride system compound semiconductor and GaN, at least part of the III group element may be substituted with boron (B), thallium (Tl) or the like, and at least part of nitrogen (N) can be substituted with phosphorous (P), arsenic (As), antimony (Sb), bismuth (Bi) or the like.

In addition, the III group nitride system compound semiconductor may be such as to contain an arbitrary dopant. Silicon (Si), germanium (Ge), selenium (Se), tellurium (Te), carbon (C) and the like can be used as n-type impurities. Magnesium (Mg), zinc (Zn), beryllium (Be), calcium (ca), strontium (Sr), barium (Ba) and the like can be used as p-type impurities. Note that although the III group nitride system compound semiconductor can be exposed to electron beam radiation, plasma radiation or heat in an oven after having been doped with a p-type impurity, this is not inevitable.

A III group nitride system compound semiconductor layer can be formed by a metal organic chemical vapor deposition (MOCVD) method. All the semiconductor layers which make up the device do not have to be formed by the MOCVD method, and a molecular beam epitaxy (MBE) method, a hydride vapor phase epitaxy (HVPE) method, a sputtering method, an ion plating method or the like can be used in parallel.

A homo-structure, a hetero-structure or a double hetero-structure having an MIS junction, a PIN junction or a pn junction can be used for the configuration of the light-emitting semiconductor device. A quantum well structure (a single quantum sell structure or a double quantum well structure) can be adopted as the light-emitting layer.

In this embodiment, the configurations of electrodes (in particular, a p bonding electrode and an n bonding electrode) on upper surfaces of the red light-emitting semiconductor device 21 which emits red-base light and the green light-emitting semiconductor device 21G which emits green-base light are made identical to those of the blue light-emitting semiconductor device 21B. Although the electrodes can be designed arbitrarily depending on the respective characteristics of the light-emitting semiconductor devices, the p bonding electrode and the n bonding electrode should be disposed in a point symmetrical relationship as viewed from a central point C of the upper surface of the light-emitting semiconductor device as a center of symmetry, whereby even in the event that the light-emitting semiconductor devices are rotated through 180 degrees about the central points C thereof, the position of one bonding electrode is kept unchanged. Namely, the position where a wire is to be bonded is kept unchanged.

In the example shown in FIG. 3, although the pair of bonding electrodes is disposed substantially centrally of a pair of facing sides on the light-emitting surface (the upper surface) of the light-emitting semiconductor device, the pair of bonding electrodes may be disposed in diagonally facing corner portions.

FIG. 4(A) shows how the light-emitting semiconductor devices 21R, 21G, 21B are disposed when the cathodes thereof are made common (when the cathode commonized type is adopted). FIG. 4(B) is a circuit diagram therefor.

Figure 4:
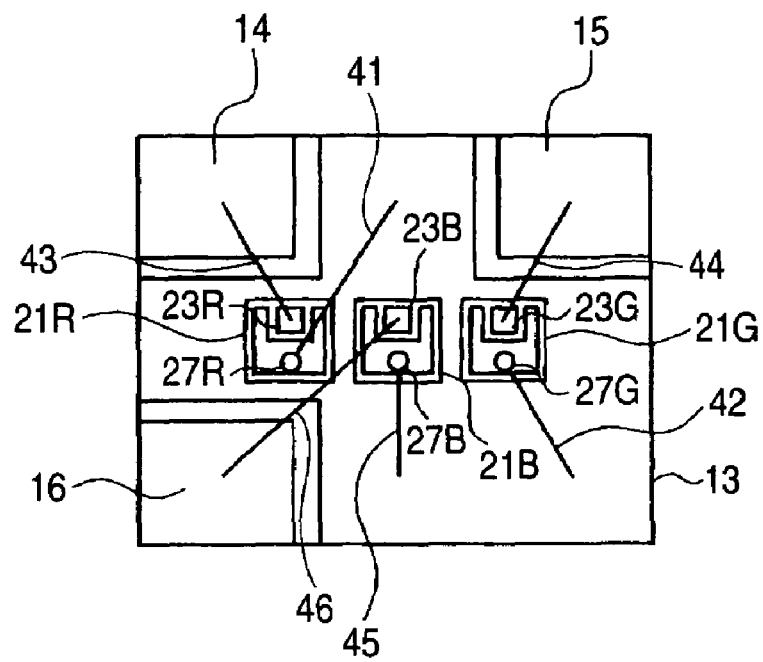
FIG. 4(A) is an exemplary diagram showing a configuration adopted when cathodes of light-emitting semiconductor devices are commonized for use.
FIG. 4(B) is a circuit diagram therefor.
Figure 4:
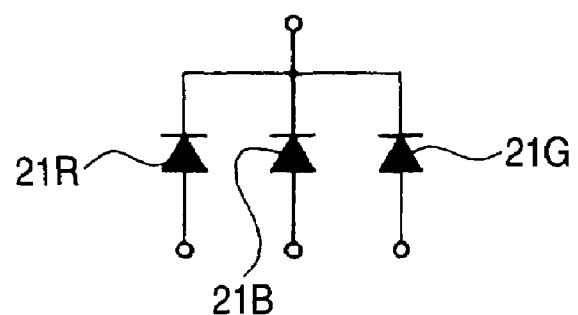

In FIG. 4, the blue light-emitting semiconductor device 21B is disposed at the central point of the bottom surface of the package 10, and the red light-emitting semiconductor device 21R and the green light-emitting semiconductor device 21G are disposed on both the sides of the blue light-emitting semiconductor device 21B at the same intervals, so that as viewed from the top, respective central points of the three light-emitting semiconductor devices 21R, 21G, 21B are aligned on an imaginary straight line. By this configuration, the center of gravity of the central points of the three light-emitting semiconductor devices 21R, 21G, 21B (more specifically, the center of gravity of an imaginary triangle which is formed in such a way that the centers of the three light-emitting semiconductor devices 21R, 21G, 21B constitute apexes of the imaginary triangle formed) coincides with the central point of the blue light-emitting semiconductor device 21B, and the central point of this blue light-emitting semiconductor device 21B coincides with the central point of the bottom surface of the package 10. By this configuration, light components emitted from the respective light-emitting semiconductor devices are uniformly balanced in light emitted from the light-emitting device 1. Consequently, light emitted from the light-emitting device can easily be controlled to an arbitrary color.

In this embodiment, the blue light-emitting semiconductor device 21B is disposed in the center of a base of an imaginary triangle which is formed by the first to third electrodes 14, 15, 16. In addition, the green light-emitting semiconductor device 21G is disposed out of the imaginary triangle, while the red light-emitting semiconductor device 21R is disposed inside the imaginary triangle. By disposing the light-emitting semiconductor devices in this way, a sixth bonding wire 46 is suspended from the n bonding electrode 23B of the blue light-emitting semiconductor device 21B to the third electrode 16, and a fourth bonding wire 44 is suspended from the n bonding electrode 23G of the green light-emitting semiconductor device 21G to the second electrode 15. These fourth bonding wire 44 and sixth bonding wire 46 become parallel to the base of the imaginary triangle. In addition, a third bonding wire 43 is suspended from the n bonding electrode 23R of the red light-emitting semiconductor device 21R to the first electrode 14. This third bonding wire is disposed substantially vertical to the fourth and sixth bonding wires 44, 46.

In this way, the wiring patterns of the bonding wires suspended from the respective light-emitting semiconductor devices to the first to third electrodes 14, 15, 16, which are independent from one another are made parallel or vertical, whereby not only can the intersection of the bonding wires be avoided but also the wiring work can be facilitated. In addition, the degree of freedom in bonding wires 41, 42, 45 from the respective light-emitting semiconductor devices 21R, 21G, 21B on the common electrode 13 is increased.

Figure 5:
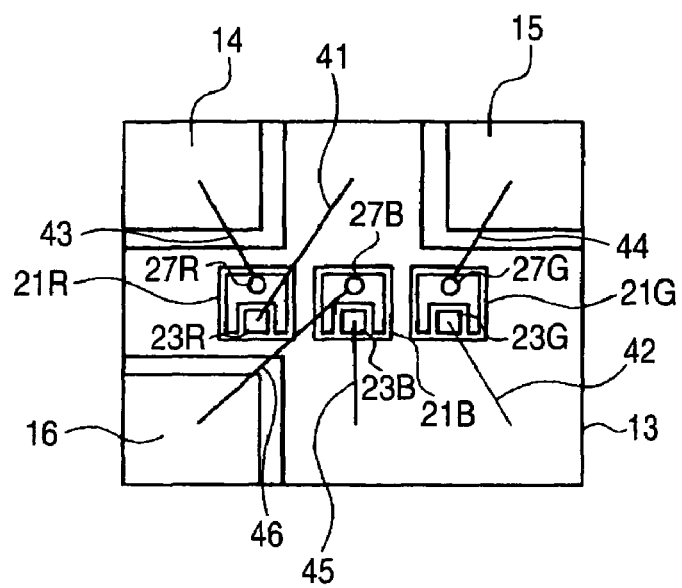
FIG. 5(A) is an exemplary diagram showing a configuration adopted when anodes of the light-emitting semiconductor devices are commonized for use.
FIG. 5(B) is a circuit diagram therefor.
Figure 5:
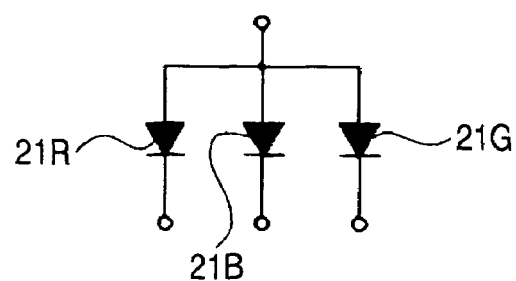

FIG. 5 shows a state in which the respective light-emitting semiconductor devices 21R, 21G, 21B are rotated through 180 degrees in the same positions on the common electrode 13. In the light-emitting semiconductor devices 21R, 21G, 21B, although the p bonding electrode and the n bonding electrode are replaced by each other, the position of the bonding electrode remains unchanged. Consequently, there should be no change in the pattern of the bonding wires 41 to 46 from the pattern shown in FIG. 4.

Thus, according to the light-emitting device 1 of the invention, the cathodes of the three light-emitting semiconductor devices can be commonized using the package 10, and similarly, the anodes thereof can be commonized. The same light-emitting semiconductor devices can be used when either of the two types of commonization is adopted. In addition, since the pattern of the bonding wires remains the same in either of the commonization types, a commonized manufacturing process can be attained for the two commonization types.

Figure 6:
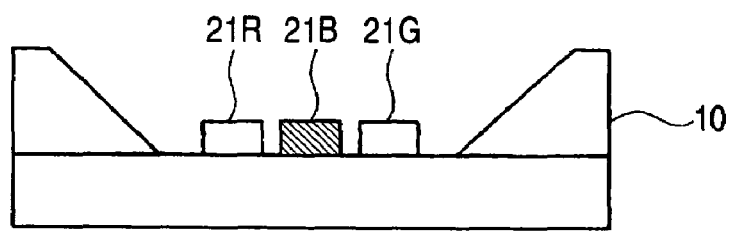
Figure 6:
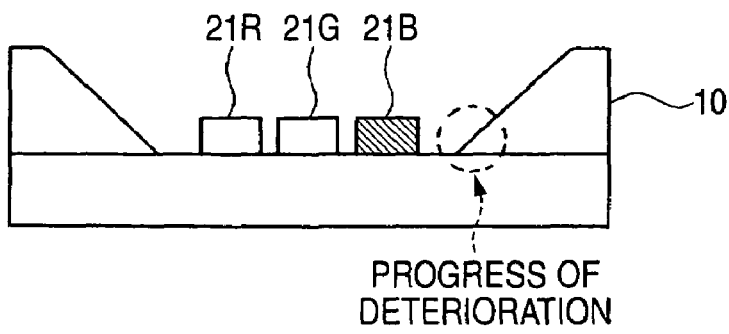

In addition, in this embodiment, the blue light-emitting semiconductor device 21B is disposed in the central point of the package 10 (refer to FIG. 6). Light emitted from the blue light-emitting semiconductor device 21B has larger energy than those of light emitted from the other light-emitting semiconductor devices 21R, 21G. Consequently, a longer distance can be secured between the reflecting wall 12 of the package 10 and the blue light-emitting semiconductor device 21B, whereby the deterioration of the reflecting wall 12 can be prevented. Consequently, the service life of the light-emitting device can be extended.

While in the embodiment, the light-emitting device is illustrated in which the three light-emitting semiconductor devices are mounted, in this invention, the number of light-emitting semiconductor devices is not limited to three. For example, when two light-emitting semiconductor devices are used, in the examples shown in FIGS. 4, 5, the central device and the third electrode 16 are omitted.

The invention is not limited to the embodiment and the description of the embodiment in any way. Modified examples that can easily be made by those skilled in the art to which the invention pertains without departing from the spirit and scope of the claims of the invention are included in the invention.

What is claimed is:
1. A light-emitting device, comprising:
a first light-emitting semiconductor device and a second light-emitting semiconductor device each having a first bonding electrode and a second bonding electrode on an upper surface thereof; and
a package on which the first and second light-emitting semiconductor devices are mounted, said package comprising:
a common electrode which is connected commonly to the first bonding electrodes of the first and second light-emitting semiconductor devices;
a first electrode which is connected to the second bonding electrode of the first light-emitting semiconductor device; and
a second electrode which is connected to the second bonding electrode of the second light-emitting semiconductor device,
wherein in the first light-emitting semiconductor device and the second light-emitting semiconductor device, the first bonding electrode and the second bonding electrode are disposed in positions which lie in a point symmetrical relationship across a central point of each light-emitting semiconductor device as a center of symmetry,
wherein the first and second light-emitting semiconductor devices are mounted on the common electrode, a first bonding wire is suspended between the first bonding electrode of the first light-emitting semiconductor device and the common electrode, a second bonding wire is suspended between the first bonding electrode of the second light-emitting semiconductor device and the common electrode, a third bonding wire is suspended between the second bonding electrode of the first light-emitting semiconductor device and the first electrode, and a fourth bonding wire is suspended between the second bonding electrode of the second light-emitting semiconductor device and the second electrode, and wherein the first light-emitting semiconductor device comprises a light-emitting semiconductor device which emits a red-base light.

2. The light-emitting device as set forth in claim 1, further comprising:
a third light-emitting semiconductor device comprising a first bonding electrode and a second bonding electrode, the first bonding electrode and the second bonding electrode being disposed in the third light-emitting semiconductor device in positions which lie in a point symmetrical relationship across a central point of the third light-emitting semiconductor device as a center of symmetry,
wherein a third electrode is provided on the package, the second light-emitting semiconductor device constitutes a light-emitting semiconductor device which emits a green-base light, and the third light-emitting semiconductor device is a light-emitting semiconductor device which emits a blue-base light, and
wherein the third light-emitting semiconductor device is mounted on the common electrode, and a fifth bonding wire is suspended between the first bonding electrode thereof and the common electrode and a sixth bonding wire is suspended between the second bonding electrode of the third light-emitting semiconductor device and the third electrode.

3. The light-emitting device as set forth in claim 2, wherein when viewing the first, second, and third light-emitting semiconductor devices from a top, a center of gravity of central points of the light-emitting semiconductor devices coincides with a central point of a bottom surface of the package.

4. The light-emitting device as set forth in claim 3, wherein the third light-emitting semiconductor device that emits the blue-base light is disposed at a central point of the package.

5. The light-emitting device as set forth in claim 4, wherein the bottom surface of the package is rectangular, the first, second, and third electrodes are formed in three corner portions thereof, and the third light-emitting semiconductor device which emits the blue-base light is disposed on a base of an imaginary triangle that is formed by the first, second, and third electrodes.

6. The light-emitting device as set forth in claim 1, wherein an exposed region of the common electrode is disposed between the first electrode and the second electrode.

7. The light-emitting device as set forth in claim 1, wherein the first bonding wire is suspended between the first bonding electrode of the first light-emitting semiconductor device and an area of the common electrode disposed between the first electrode and the second electrode.

8. The light-emitting device as set forth in claim 1, further comprising:
a third light-emitting semiconductor device comprising a first bonding electrode and a second bonding electrode, the first bonding electrode and the second bonding electrode being disposed in the third light-emitting semiconductor device in positions which lie in a point symmetrical relationship across a central point of the third light-emitting semiconductor device as a center of symmetry.

9. The light-emitting device as set forth in claim 8, wherein the third light-emitting semiconductor device is disposed between the first light-emitting semiconductor device and the second light-emitting semiconductor device.

10. The light-emitting device as set forth in claim 8, wherein said package further comprises a third electrode, and
wherein the third light-emitting semiconductor device is mounted on the common electrode, a fifth bonding wire is suspended between the first bonding electrode thereof and the common electrode, and a sixth bonding wire is suspended between the second bonding electrode of the third light-emitting semiconductor device and the third electrode.

11. The light-emitting device as set forth in claim 8, wherein the second light-emitting semiconductor device emits a green-base light, and the third light-emitting semiconductor device emits a blue-base light.

12. The light-emitting device as set forth in claim 8, wherein when viewing the first, second, and third light-emitting semiconductor devices from a top, a center of gravity of central points of the light-emitting semiconductor devices coincides with a central point of a bottom surface of the package.

13. The light-emitting device as set forth in claim 8, wherein the third light-emitting semiconductor device emits a blue-base light and is disposed at a central point of the package.

14. The light-emitting device as set forth in claim 8, wherein a bottom surface of the package has a rectangular shape, in which the first, second, and third electrodes are formed in three corner portions thereof.

15. The light-emitting device as set forth in claim 14, wherein the third light-emitting semiconductor device which emits a blue-base light is disposed on a base of an imaginary triangle that is formed by the first, second, and third electrodes.

16. The light-emitting device as set forth in claim 1, wherein in said each of the first and second light-emitting semiconductor devices, said first bonding electrode and said second bonding electrode are disposed respectively in a center of a pair of facing sides on a light-emitting surface of said each of the first and second light-emitting semiconductor devices.

17. The light-emitting device as set forth in claim 1, wherein an exposed region of the common electrode spaces apart the first light-emitting semiconductor device from the second light-emitting semiconductor device.

18. A light-emitting device, comprising:
a first light-emitting semiconductor device, a second light-emitting semiconductor device, and a third light-emitting semiconductor device, each having a first bonding electrode and a second bonding electrode on an upper surface thereof; and
a package on which the first, second, and third light-emitting semiconductor devices are mounted, said package comprising:
a common electrode which is connected commonly to the first bonding electrodes of the first, second, and third light-emitting semiconductor devices;
a first electrode which is connected to the second bonding electrode of the first light-emitting semiconductor device;
a second electrode which is connected to the second bonding electrode of the second light-emitting semiconductor device; and
a third electrode which is connected to the second bonding electrode of the third light-emitting semiconductor device,
wherein in the first, second, and third light-emitting semiconductor devices, the first bonding electrode and the second bonding electrode are disposed in positions which lie in a point symmetrical relationship across a central point of each light-emitting semiconductor device as a center of symmetry,
wherein the first, second, and third light-emitting semiconductor devices are mounted on the common electrode, a first bonding wire is suspended between the first bonding electrode of the first light-emitting semiconductor device and the common electrode, a second bonding wire is suspended between the first bonding electrode of the second light-emitting semiconductor device and the common electrode, a third bonding wire is suspended between the second bonding electrode of the first light-emitting semiconductor device and the first electrode, a fourth bonding wire is suspended between the second bonding electrode of the second light-emitting semiconductor device and the second electrode, a fifth bonding wire is suspended between the first bonding electrode thereof and the common electrode, and a sixth bonding wire is suspended between the second bonding electrode of the third light-emitting semiconductor device and the third electrode.

19. The light-emitting device as set forth in claim 18, wherein an exposed region of the common electrode spaces apart the first light-emitting semiconductor device from the second light-emitting semiconductor device, said exposed region of the common electrode being disposed between the first electrode and the second electrode.

20. The light-emitting device as set forth in claim 18, wherein a bottom surface of the package has a rectangular shape, in which the first, second, and third electrodes are formed in three corner portions thereof, and the third light-emitting semiconductor device which emits a blue-base light is disposed on a base of an imaginary triangle that is formed by the first, second, and third electrodes.

* * * * *